(12) United States Patent
Sung et al.

(10) Patent No.: US 11,937,506 B2
(45) Date of Patent: Mar. 19, 2024

(54) THERMOELECTRIC ELEMENT

(71) Applicant: LG INNOTEK CO., LTD., Seoul (KR)

(72) Inventors: Myoung Seok Sung, Seoul (KR); Tae Hee Kim, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 37 days.

(21) Appl. No.: 16/482,522

(22) PCT Filed: Feb. 6, 2018

(86) PCT No.: PCT/KR2018/001590
§ 371 (c)(1),
(2) Date: Jul. 31, 2019

(87) PCT Pub. No.: WO2018/143780
PCT Pub. Date: Aug. 9, 2018

(65) Prior Publication Data
US 2021/0135078 A1   May 6, 2021

(30) Foreign Application Priority Data

Feb. 6, 2017   (KR) .................. 10-2017-0016094

(51) Int. Cl.
*H10N 10/82*   (2023.01)
*H10N 10/01*   (2023.01)
(Continued)

(52) U.S. Cl.
CPC ............ *H10N 10/82* (2023.02); *H10N 10/01* (2023.02); *H10N 10/17* (2023.02); *H10N 10/852* (2023.02)

(58) Field of Classification Search
CPC ......... H01L 35/10; H01L 35/32; H01L 35/34; H01L 35/16; H01L 35/02; H01L 35/12;
(Continued)

(56) References Cited

U.S. PATENT DOCUMENTS 5,936,192 A * 8/1999 Tauchi ................. H01L 35/325
136/203
10,559,736 B2   2/2020 Makino et al.
(Continued)

FOREIGN PATENT DOCUMENTS

CN   101232071 A   7/2008
CN   101807662     8/2010
(Continued)

OTHER PUBLICATIONS

Machine translation of JP-2001160632-A, Suzuki, Junya. (Year: 2001).*
(Continued)

*Primary Examiner* — Mayla Gonzalez Ramos
(74) *Attorney, Agent, or Firm* — KED & Associates LLP

(57) ABSTRACT

A thermoelectric element according to an embodiment comprises: a first substrate; a first electrode part disposed on the first substrate; a thermoelectric semiconductor disposed on the first electrode part; second electrode parts disposed on the thermoelectric semiconductor; and a second substrate disposed on the second electrode parts, wherein the second substrate comprises: a first surface; and a second surface opposite to the first surface, the second electrode parts are disposed on the first surface, a terminal electrode part formed by extending at least one of the second electrode parts is disposed on the second surface, and the second substrate is formed between the terminal electrode part and the second electrode parts.

14 Claims, 17 Drawing Sheets

(51) Int. Cl.
*H10N 10/17* (2023.01)
*H10N 10/852* (2023.01)

(58) Field of Classification Search
CPC ........ H10N 10/00; H10N 10/17; H10N 10/80; H10N 10/81; H10N 10/82
See application file for complete search history.

(56) References Cited

U.S. PATENT DOCUMENTS

| | | | |
|---|---|---|---|
| 2005/0241690 A1* | 11/2005 | Tajima | H01L 35/08 136/212 |
| 2007/0028955 A1* | 2/2007 | Sogou | H05K 1/0204 136/200 |
| 2011/0259385 A1 | 10/2011 | Hiroyama | |
| 2013/0019524 A1 | 6/2013 | Kim et al. | |
| 2016/0290684 A1 | 10/2016 | Lee et al. | |

FOREIGN PATENT DOCUMENTS

| | | |
|---|---|---|
| CN | 103137577 A | 6/2013 |
| CN | 106025055 A | 10/2016 |
| JP | 10-065224 A | 3/1998 |
| JP | 2000-068564 A | 3/2000 |
| JP | 2000-349353 A | 12/2000 |
| JP | 2001-160632 | 6/2001 |
| JP | 2001160632 A * | 6/2001 |
| JP | 2002-270906 A | 9/2002 |
| JP | 2004-158582 A | 6/2004 |
| JP | 2004-296546 A | 10/2004 |
| JP | 2005-175022 | 6/2005 |
| JP | 2005-294760 A | 10/2005 |
| JP | 2008-244100 | 10/2008 |
| JP | 2010-118475 A | 5/2010 |
| JP | 2016-015838 A | 1/2016 |

OTHER PUBLICATIONS

Japanese Office Action dated Jan. 5, 2022 issued in Application 2019-540635.
Chinese Office Action dated Sep. 21, 2022 issued in Application 201880010507.1.
Japanese Office Action dated Oct. 4, 2022 issued in Application 2019-540635.

* cited by examiner

FIG. 15
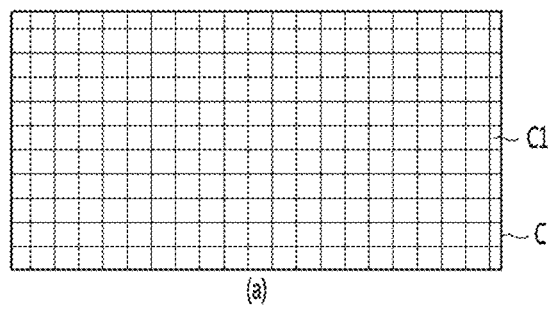
(a)
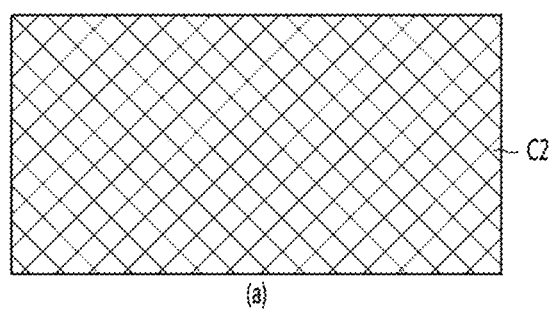
(a)
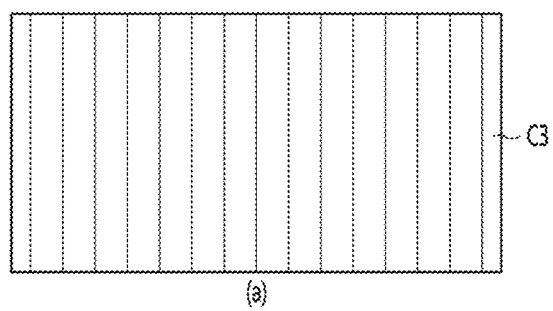
(a)
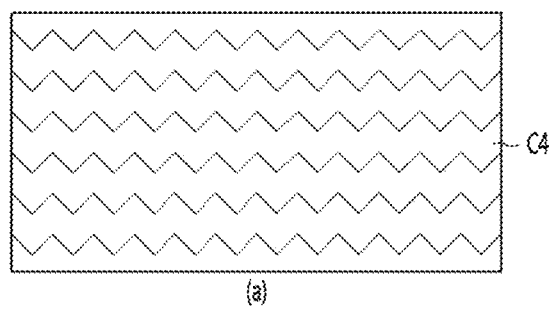
(a)

FIG. 16
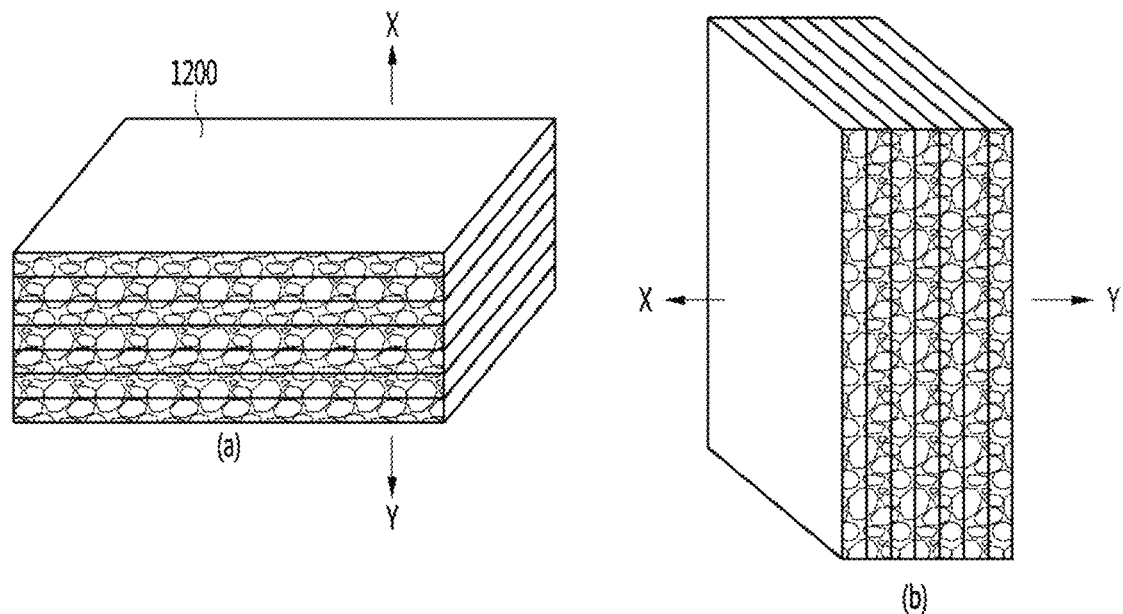
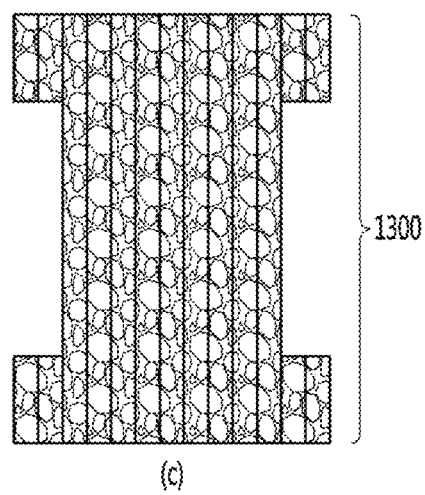

THERMOELECTRIC ELEMENT

CROSS-REFERENCE TO RELATED PATENT APPLICATIONS

This application is a U.S. National Stage Application under 35 U.S.C. § 371 of PCT Application No. PCT/KR2018/001590, filed Feb. 6, 2018, which claims priority to Korean Patent Application No. 10-2017-0016094, filed Feb. 6, 2017, whose entire disclosures are hereby incorporated by reference.

TECHNICAL FIELD

An embodiment relates to a thermoelectric element.

BACKGROUND ART

A thermoelectric phenomenon is a phenomenon generated by movement of electrons and holes in a material, and refers to a direct energy conversion between heat and electricity.

A thermoelectric element generally refers to an element using the thermoelectric phenomenon, and has a structure in which a P-type thermoelectric material and an N-type thermoelectric material are bonded between metal electrodes to form a PN junction pair.

Thermoelectric elements may be classified into an element using temperature change of an electric resistor, an element using a Seebeck effect, which is a phenomenon in which an electromotive force is generated by a temperature difference, an element using a Peltier effect, which is a phenomenon in which heat is absorbed or generated by a current, and the like.

Thermoelectric elements are widely applied to home appliances, electronic parts, communication parts, and the like. For example, the thermoelectric elements may be applied to a cooling device, a heating device, a power generation device, and the like. Accordingly, the demand for thermoelectric performance of the thermoelectric element is gradually increasing.

Such a thermoelectric element may receive an electric current through a wiring electrode, that is, a terminal wire, and for example, the wiring electrode may be connected to an electrode layer of the thermoelectric element on an upper substrate or a lower substrate.

However, as the thermoelectric element is miniaturized, a connection failure between the wiring electrode and the electrode layer may be increased.

In order to solve such a failure problem, a method of forming widely a terminal pad portion on the substrate instead of the wiring electrode and connecting it with an external circuit by soldering may be used. However, in such a case, since an external substrate should be formed widely, there is a problem that the total area of the element is widened, and the performance with respect to the area is lowered.

In addition, in order to solve such a problem, a method of disposing a post (metal column) on the lower substrate instead of the terminal wire and wire-bonding an external power source and the thermoelectric element through the wiring electrode may be used.

However, even in such a case, since the lower substrate should be formed wider than the upper substrate, there is a problem that the performance with respect to the area is lowered.

In addition, in order to solve such a problem, the external power source and the thermoelectric element may be wire-bonded on the upper substrate through the wiring electrode. However, in this case, since the wiring electrode is disposed at a portion serving as a heat absorbing part, a problem that the performance of the heat absorbing part is lowered due to the heat which may be generated by supplying a current or the heat generated by the wiring electrode may occur.

Therefore, a thermoelectric element having a new structure capable of solving the above problems is required.

DISCLOSURE

Technical Problem

An embodiment is directed to providing a thermoelectric element that may prevent a bonding failure of a terminal wire and realize miniaturization while having improved efficiency.

Technical Solution

A thermoelectric element according to an embodiment includes: a first substrate; a first electrode part disposed on the first substrate; a thermoelectric semiconductor disposed on the first electrode part; a second electrode part disposed on the thermoelectric semiconductor; and a second substrate disposed on the second electrode part, wherein the second substrate includes a first surface and a second surface opposite to the first surface, the second electrode part is disposed on the first surface, a terminal electrode part formed by extending at least one of the second electrode parts is disposed on the second surface, and the second substrate is formed between the terminal electrode part and the second electrode part.

Advantageous Effects

A thermoelectric element according to an embodiment may reduce heat moving from a terminal electrode part toward a second electrode part.

In detail, heat generated at the terminal electrode part in which a wiring electrode is disposed may move toward the second electrode part, but the thermoelectric element according to the embodiment may separate the terminal electrode part and the second electrode part by a through hole and a buffer member filled inside the through hole to reduce an amount of heat moved toward the second electrode part.

Therefore, it is possible to reduce deterioration of cooling performance in a second substrate serving as a cooling part by the heat.

In addition, in the thermoelectric element according to the embodiment, a thickness of a region in which the terminal electrode part is disposed may be larger than that of a region in which the second electrode part is disposed. Further, thermal conductivity of the region in which the terminal electrode part is disposed may be lower than that of the region in which the second electrode part is disposed. Furthermore, it is possible to reduce heat moved in the vertical direction in the region in which the terminal electrode part is disposed.

Accordingly, when the terminal electrode part and the wiring electrode are bonded by a stepped portion in the region in which the terminal electrode part is disposed, mechanical impact due to a step with a frame may be alleviated, thereby improving reliability of the thermoelectric element.

In addition, the heat generated at the terminal electrode and the wiring electrode may reduce the amount of the heat moved toward the second electrode part by reducing the heat transferred in the vertical direction.

DESCRIPTION OF DRAWINGS

FIGS. 14 to 16 are views illustrating a thermoelectric leg of a stacked structure.

MODES OF THE INVENTION

Figure 1:
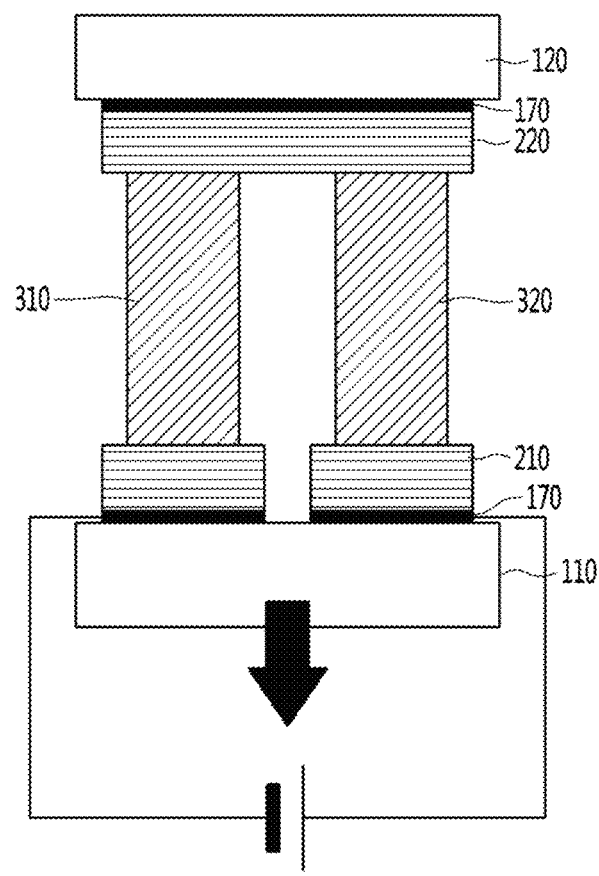
FIG. 1 is a cross-sectional view of a thermoelectric element according to embodiments.

While the present invention is susceptible to various modifications and may take on various alternative forms, specific embodiments thereof are shown by way of example in the drawings and will be described herein in detail. However, it should be understood that there is no intent to limit the present invention to the particular forms disclosed. On the contrary, the present invention is to cover all modifications, equivalents, and alternatives falling within the spirit and scope of the claims.

It should be understood that, although the terms first, second, and the like may be used herein to describe various elements, these elements are not limited by these terms. The terms are only used to distinguish one element from another. For example, a first element could be termed a second element without departing from the scope of the present invention, and a second element could similarly be termed a first element. As used here, the term "and/or" includes any and all combinations of one or more of the associated listed items.

It should be understood that, when an element is referred to as being "connected" or "coupled" to another element, the element may be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It should be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It should be further understood that terms, such as those defined in commonly used dictionaries, should be interpreted as having a meaning that is consistent with their meaning in the context of the relevant art and are not to be interpreted in an idealized or overly formal sense unless expressly so defined here.

Hereinafter, exemplary embodiments will be described in detail with reference to the accompanying drawings. The same or corresponding elements are denoted by the same reference numerals regardless of drawings, and repeated descriptions thereof will be omitted FIG. 1 is a cross-sectional view of a thermoelectric element included in embodiments.

Referring to FIG. 1, a thermoelectric element 100 may include a first substrate 110, a second substrate 120, a first electrode part 210, a second electrode part 220, and a thermoelectric semiconductor 300. In addition, the thermoelectric semiconductor 300 may include a first thermoelectric semiconductor 310 and a second thermoelectric semiconductor 320. The first substrate 110 may be a lower substrate and the second substrate 120 may be an upper substrate disposed on the first substrate 110.

The first electrode part 210 may be disposed between the first substrate 110 and lower bottom surfaces of the first thermoelectric semiconductor 310 and the second thermoelectric semiconductor 320. The second electrode part 220 may be disposed between the second substrate 120 and upper bottom surfaces of the first thermoelectric semiconductor 310 and the second thermoelectric semiconductor 320.

Accordingly, a plurality of the first thermoelectric semiconductors 310 and a plurality of the second thermoelectric semiconductors 320 may be electrically connected by the first electrode part 210 and the second electrode part 220. A pair of the first thermoelectric semiconductor 310 and the second thermoelectric semiconductor 320 disposed between the first electrode part 210 and the second electrode part 220 and electrically connected to each other may form a unit sell.

For example, when a voltage is applied to the first electrode part 210 and the second electrode part 220 through wires, a substrate in which a current flows from the first thermoelectric semiconductor 310 to the second thermoelectric semiconductor 320 may absorb heat to act as a cooling portion due to the Peltier effect, and a substrate in which a current flows from the second thermoelectric semiconductor 320 to the first thermoelectric semiconductor 310 may be heated and act as a heat generating portion.

For example, the first substrate 110 may act as the heat generating portion, and the second substrate 120 may act as the cooling portion.

The first thermoelectric semiconductor 310 and the second thermoelectric semiconductor 320 may include a P-type thermoelectric leg and an N-type thermoelectric leg, respectively. For example, the first thermoelectric semiconductor 310 may include the P-type thermoelectric leg, and the second thermoelectric semiconductor 320 may include the N-type thermoelectric leg.

In detail, the first thermoelectric semiconductor 310 and the second thermoelectric semiconductor 320 may be bismuth telluride (Bi—Te)-based thermoelectric legs including bismuth (Bi) and tellurium (Ti) as main raw materials.

For example, the first thermoelectric semiconductor 310 may be a thermoelectric leg including 99 wt % to 99.999 wt % of a bismuth telluride (Bi—Te)-based main raw material containing at least one of antimony (Sb), nickel (Ni), aluminum (Al), copper (Cu), silver (Ag), lead (Pb), boron (B), gallium (Ga), tellurium (Te), bismuth (Bi), and indium (In) and 0.001 wt % to 1 wt % of a mixture containing Bi or Te, based on 100 wt % of the total weight. For example, the P-type thermoelectric leg 130 may include Bi—Se—Te as a main raw material, and may further include 0.001 wt % to 1 wt % of Bi or Te of the total weight.

The second thermoelectric semiconductor 320 may be a thermoelectric leg including 99 wt % to 99.999 wt % of a bismuth telluride (Bi—Te)-based main raw material containing at least one of selenium (Se), nickel (Ni), aluminum (Al), copper (Cu), silver (Ag), lead (Pb), boron (B), gallium (Ga), tellurium (Te), bismuth (Bi), and indium (In) and 0.001 wt % to 1 wt % of a mixture containing Bi or Te, based on 100 wt % of the total weight. For example, the N-type thermoelectric leg 140 may include Bi—Se—Te as a main raw material, and may further include 0.001 wt % to 1 wt % of Bi or Te of the total weight.

The first thermoelectric semiconductor 310 and the second thermoelectric semiconductor 320 may be formed in a bulk shape or a stack type. In general, a bulk type first thermoelectric semiconductor 310 or a bulk type second thermoelectric semiconductor 320 may be obtained through a process of heat-treating a thermoelectric material to manufacture an ingot, pulverizing and sieving the ingot to obtain powder for a thermoelectric leg, then sintering the powder, and cutting a sintered body.

A stack type first thermoelectric semiconductor 310 or a stack type second thermoelectric semiconductor 320 may be obtained through a process of stacking and cutting a unit member after applying paste containing a thermoelectric material on a sheet-shaped base material to form the unit member.

In this case, the pair of first thermoelectric semiconductors 310 and the second thermoelectric semiconductors 320 may have the same shape and volume, or may have different shapes and volumes. For example, since the electrical conduction characteristics of the first thermoelectric semiconductor 310 and the second thermoelectric semiconductor 320 are different from each other, a height or cross-sectional area of the second thermoelectric semiconductor 320 may be formed to be different from a height or cross-sectional area of the first thermoelectric semiconductor 310.

Performance of the thermoelectric element according to one embodiment of the present invention may be expressed in a Seebeck index ZT. The Seebeck index ZT may be expressed as Equation 1.

$$ZT=\alpha^2 \cdot \sigma \cdot T/k \qquad \text{Equation 1}$$

Here, $\alpha$ is a Seebeck coefficient [V/K], $\sigma$ is electrical conductivity [S/m], and $\alpha 2\sigma$ is a power factor (W/mK2). In addition, T is a temperature, and k is thermal conductivity [W/mK]. k may be expressed as $a \cdot cp \cdot \rho$, in wherein a is a thermal diffusivity [cm2/S], cp is a specific heat [J/gK], and $\rho$ is a density [g/cm3].

In order to obtain the Seebeck index of the thermoelectric element, a Z value (V/K) may be measured using a Z meter, and the Seebeck index ZT may be calculated using the measured Z value.

Here, the first substrate 110 and the first electrode part 210 disposed between the first thermoelectric semiconductor 310 and the second thermoelectric semiconductor 320, and the second substrate 120 and the second electrode part 220 disposed between the first thermoelectric semiconductor 310 and the second thermoelectric semiconductor 320 may include at least one of copper (Cu), silver (Ag), and nickel (Ni), and may have a thickness of 0.01 to 0.3 mm.

When the thickness of the first electrode part 210 or the second electrode part 220 is less than 0.01 mm, a function as an electrode may be deteriorated, and thus electric conduction performance may be lowered, and when the thickness exceeds 0.3 mm, conduction efficiency may be lowered due to an increase in resistance.

In addition, the first substrate 110 and the second substrate 120, which are opposed to each other, may be an insulating substrate or a metal substrate.

The insulating substrate may be an alumina substrate or a flexible polymer resin substrate. The flexible polymer resin substrate may include various insulating resin materials such as polyimide (PI), polystyrene (PS), polymethyl methacrylate (PMMA), cyclic olefin copolymer (COC), polyethylene terephthalate (PET), highly permeable plastic such as resin, or the like.

The metal substrate may include Cu, a Cu alloy, or a Cu—Al alloy, and a thickness thereof may be 0.1 to 0.5 mm. When the thickness of the metal substrate is less than 0.1 mm or exceeds 0.5 mm, heat radiation characteristics or thermal conductivity may be excessively high, and thus the reliability of the thermoelectric element may be deteriorated.

In addition, when the first substrate 110 and the second substrate 120 are metal substrates, a dielectric layer 170 may be further disposed between the first substrate 110 and the first electrode part 210 and between the second substrate 120 and the second electrode part 220, respectively.

The dielectric layer 170 may include a material having thermal conductivity of 5 to 10 W/K, and may be formed to a thickness of 0.01 to 0.15 mm. When the thickness of the dielectric layer 170 is less than 0.01 mm, insulation efficiency or withstand voltage characteristics may be deteriorated, and when the thickness exceeds 0.15 mm, thermal conductivity may be lowered, and thus thermal efficiency may be lowered.

In this case, the first substrate 110 and the second substrate 120 may be formed to have different sizes. For example, a volume, thickness, or area of one of t the first substrate 110 and the second substrate 120 may be formed to be greater than a volume, thickness, or area of the other one. Accordingly, heat absorption performance or heat radiation performance of the thermoelectric element may be enhanced.

In addition, a heat radiation pattern, for example, a concavo-convex pattern may be formed on a surface of at least one of the first substrate 110 and the second substrate 120. Accordingly, the heat radiation performance of the thermoelectric element may be enhanced. When the concavo-convex pattern is formed on a surface in contact with the first thermoelectric semiconductor 310 and the second thermoelectric semiconductor 320, bonding characteristics between the thermoelectric leg and the substrate may also be improved.

Figure 2:
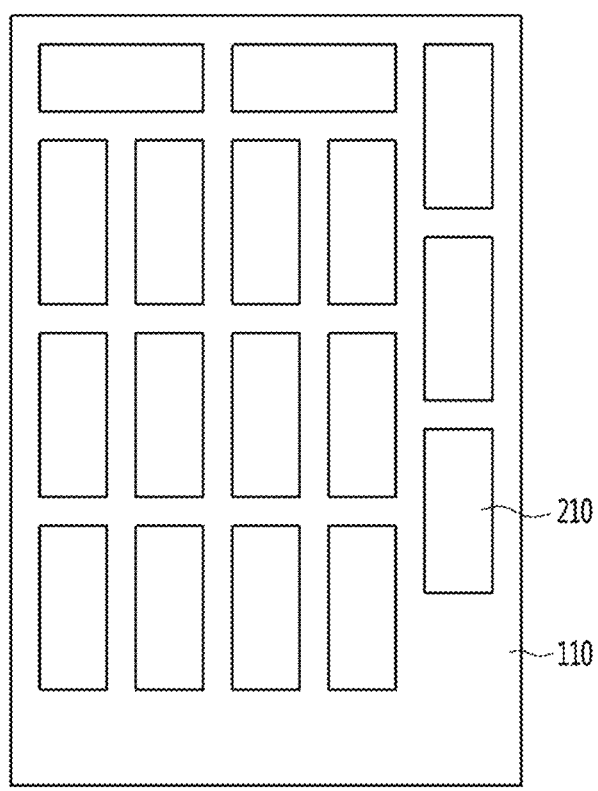
FIG. 2 is a plan view of a lower substrate of a thermoelectric element according to a first embodiment.
Figure 3:
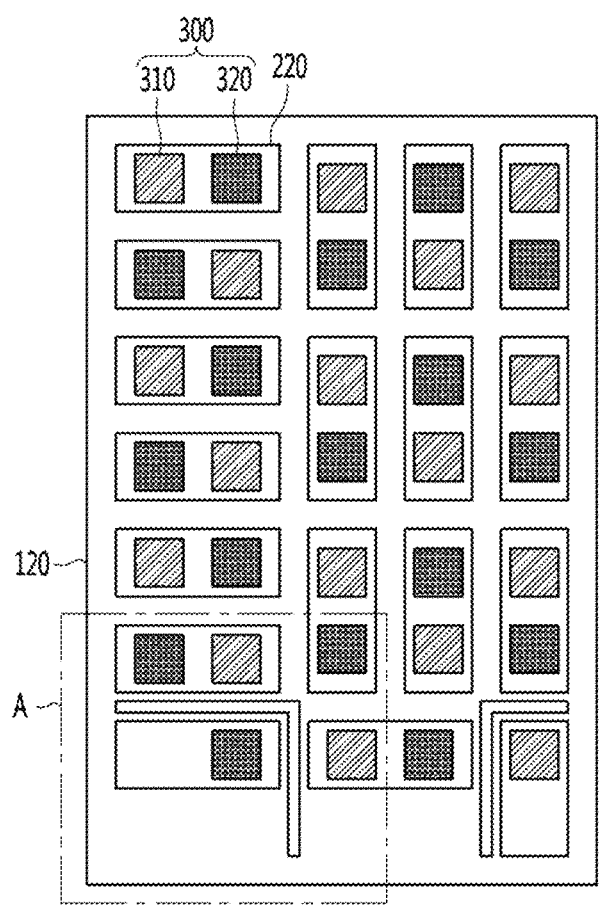
FIG. 3 is a plan view of an upper substrate of the thermoelectric element according to the first embodiment.
Figure 4:
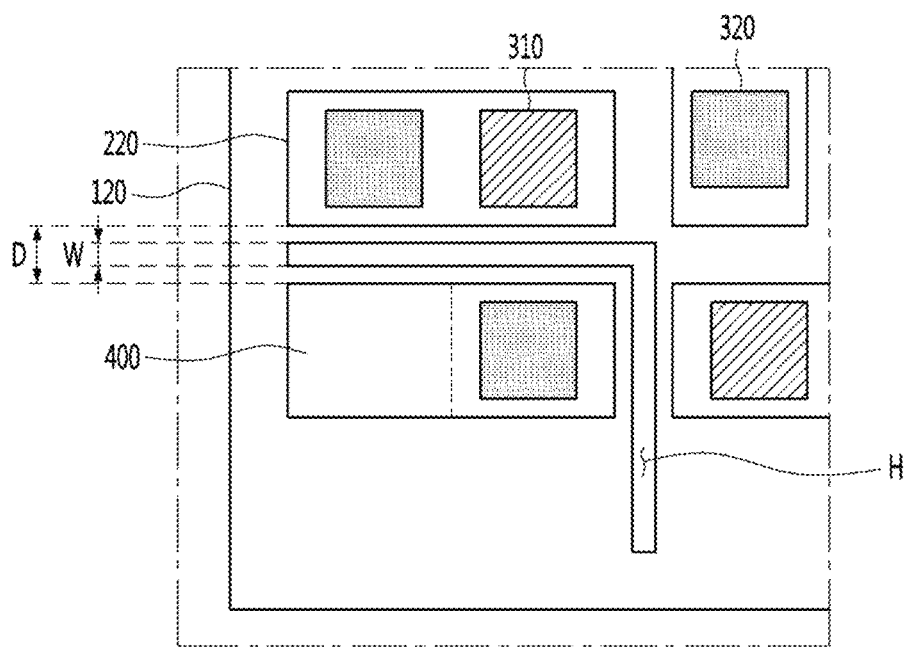
FIG. 4 is an enlarged view of a region A in FIG. 3.
Figure 5:
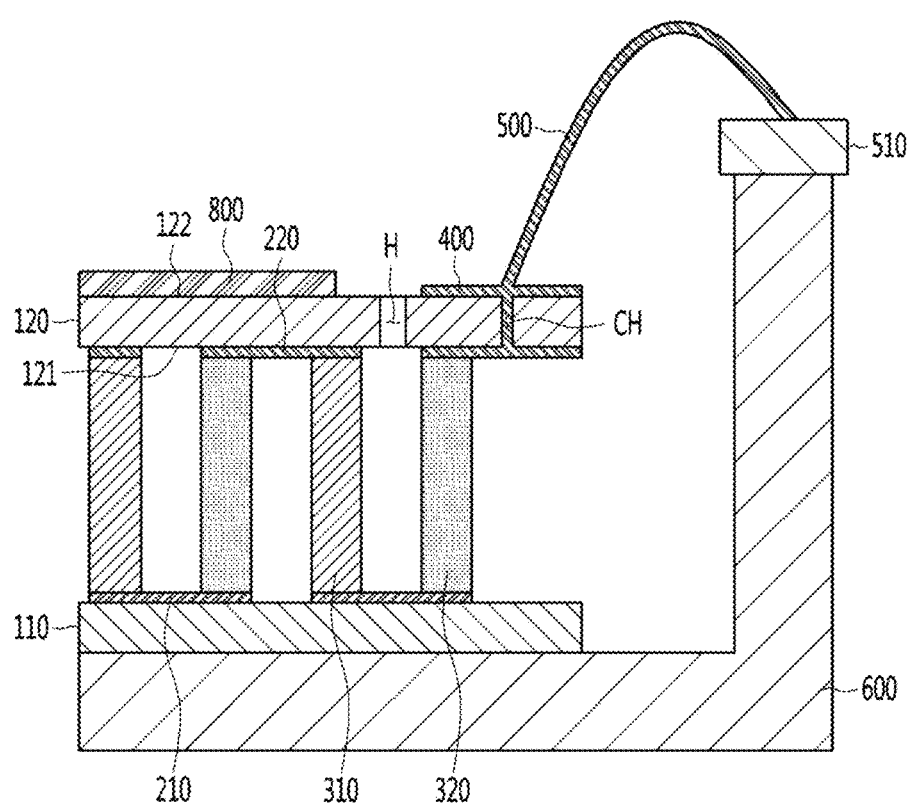
FIGS. 5 and 6 are partial cross-sectional views of the thermoelectric element according to the first embodiment.
Figure 6:
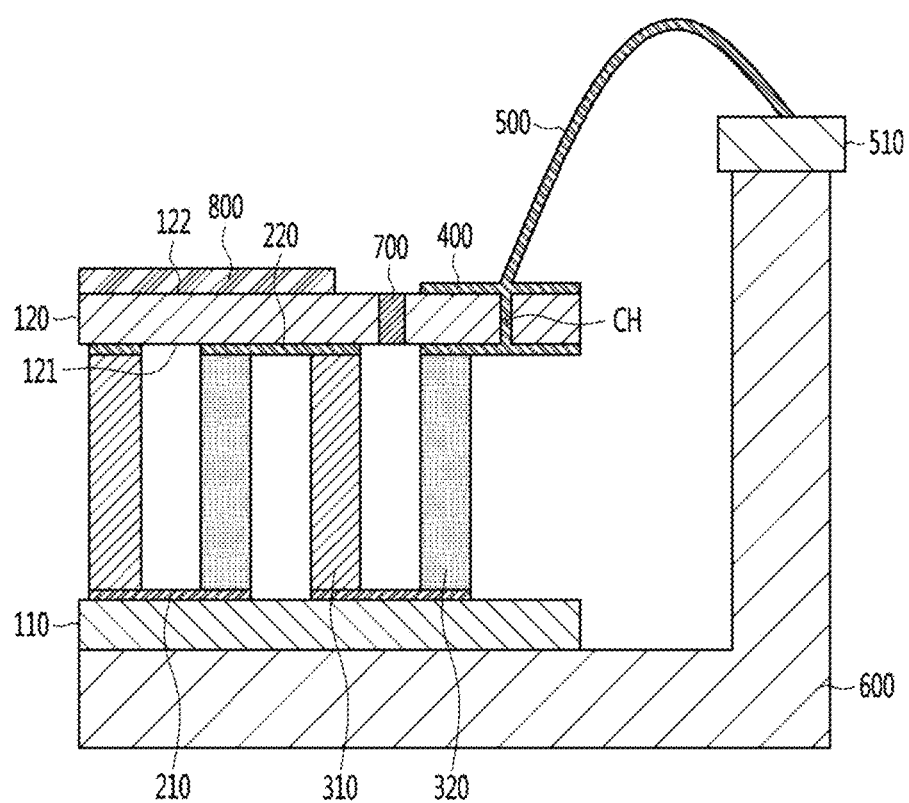
Figure 7:
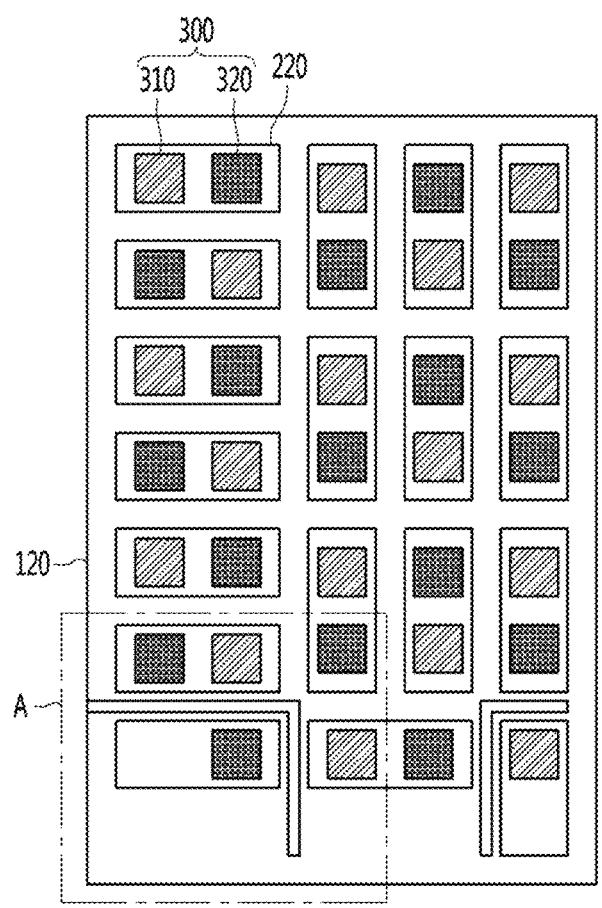
FIG. 7 is a plan view of an upper substrate of a thermoelectric element according to a second embodiment.
Figure 8:
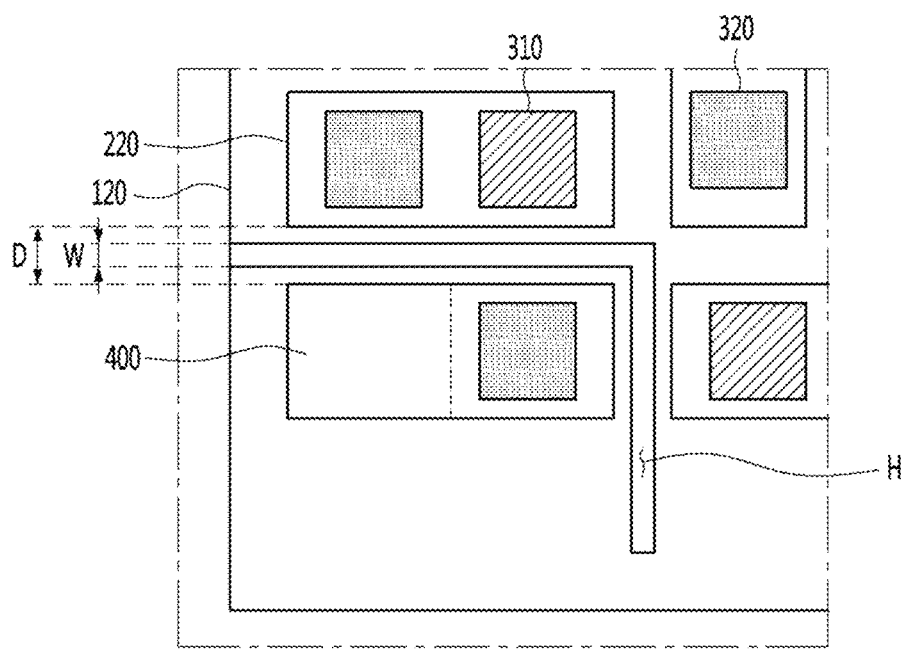
FIG. 8 is an enlarged view of a region B in FIG. 7.
Figure 9:
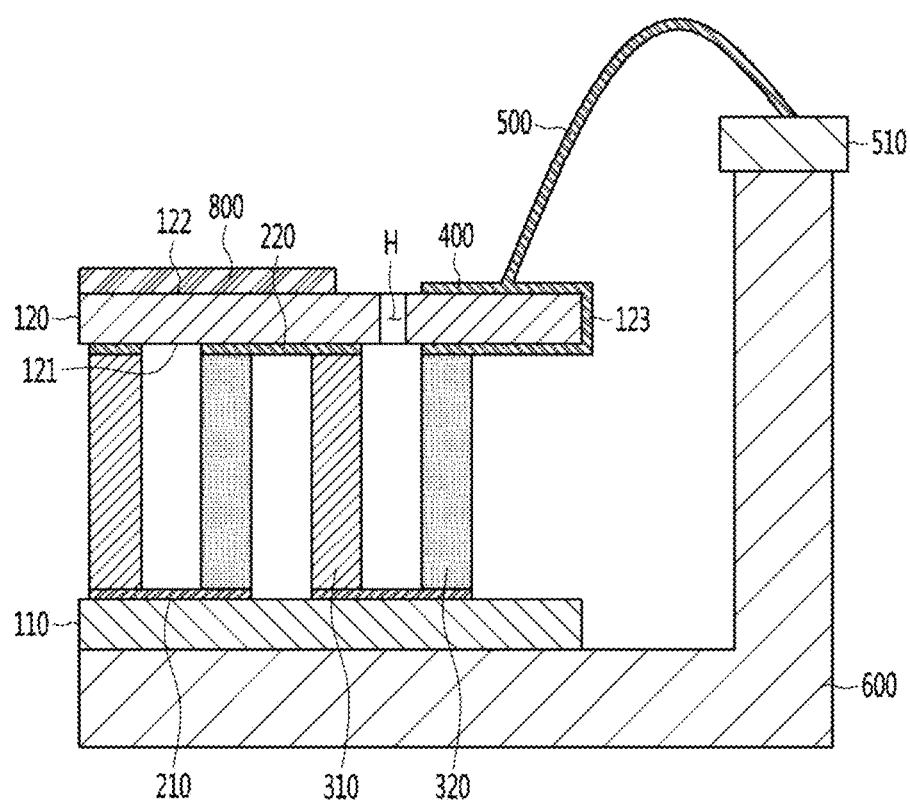
FIGS. 9 and 10 are partial cross-sectional views of the thermoelectric element according to the second embodiment.
Figure 10:
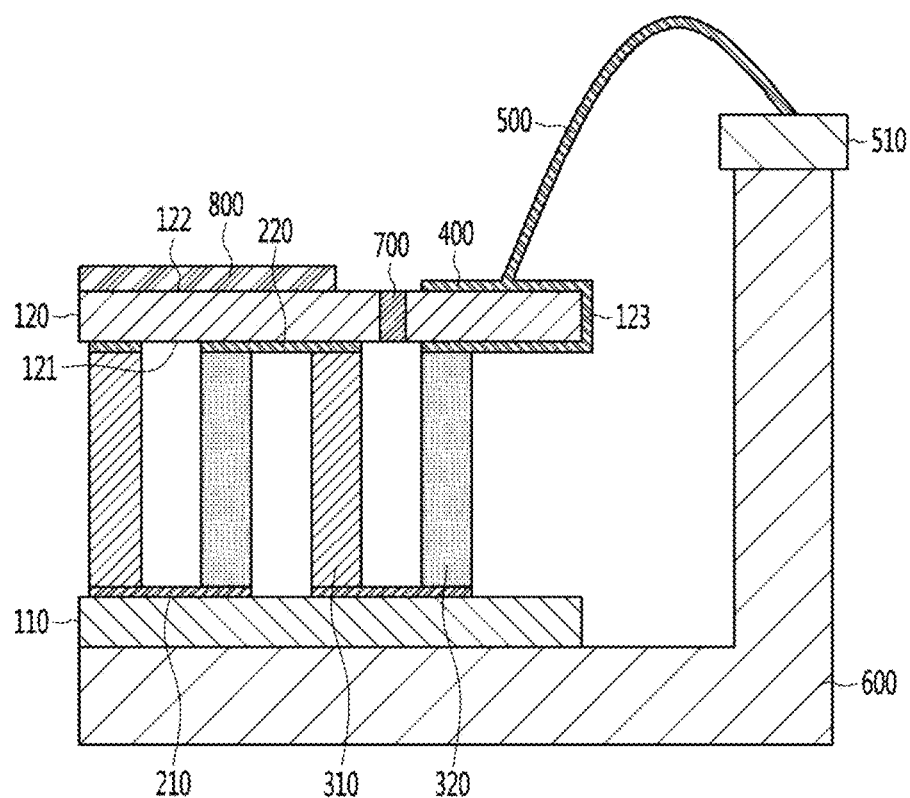

Hereinafter, a thermoelectric element according to a first embodiment will be described with reference to FIGS. 2 to 6. FIGS. 2 to 4 are plan views of a first substrate 110 and a second substrate 120 in the thermoelectric element according to the first embodiment, and FIGS. 5 and 6 are cross-sectional views of the thermoelectric element according to the first embodiment.

Referring to FIG. 2, a plurality of first electrode parts 210 may be disposed on the first substrate 110. The first electrode parts 210 may be disposed on one surface of the first substrate 110 with a pattern. That is, a plurality of first electrode patterns spaced apart from each other may be disposed on one surface of the first substrate 110.

The first thermoelectric semiconductors 310 and/or the second thermoelectric semiconductors 320 described above may be disposed in the plurality of first electrode patterns.

The first substrate 110 may be a substrate acting as a heat generating portion as a substrate in which a current flows from the second thermoelectric semiconductor 320 to the first thermoelectric semiconductor 310.

Referring to FIG. 3, a plurality of second electrode parts 220 may be disposed on the second substrate 120. The second electrode parts 220 may be disposed on one surface of the second substrate 120 with a pattern. That is, a plurality of second electrode patterns spaced apart from each other may be disposed on one surface of the second substrate 120.

The first thermoelectric semiconductors 310 and/or the second thermoelectric semiconductors 320 described above may be disposed in the plurality of second electrode patterns.

The second substrate 120 may be a substrate acting as a cooling portion as a substrate in which a current flows from the first thermoelectric semiconductor 310 to the second thermoelectric semiconductor 320.

Referring to FIGS. 5 and 6, the second substrate 120 may include a first surface 121 and a second surface 122. In detail, the second substrate 120 may include the first surface 121 and the second surface 122 opposite to the first surface 121. In detail, the second substrate 120 may include the first surface 121 and a second surface 122 facing the first surface 121.

In addition, a thermoelectric element chip 800 may be disposed on the second substrate 120. Alternatively, a separate substrate may be disposed on the second substrate, and the thermoelectric element chip 800 may be mounted on the separate substrate. That is, a thermoelectric element chip mounting substrate may be disposed on the second substrate 120.

Referring to FIGS. 3 to 6, the thermoelectric element according to the first embodiment may include a terminal electrode part 400. The terminal electrode part 400 may be an electrode connected to an external wiring. In detail, the terminal electrode part 400 may be a region to which a voltage is applied through a wiring electrode 500 from a supply part 510 disposed on an outer frame 600.

The terminal electrode part 400 may be disposed to extend from at least one second electrode part 220 of the second electrode parts 220 in one direction, for example, in the lateral direction. In detail, the terminal electrode part 400 may be disposed in contact with the second electrode part 220. In detail, the terminal electrode part 400 may be integrally formed with the second electrode part 220. In detail, the terminal electrode part 400 may be formed of the same material as the second electrode part 200.

That is, the second electrode part 220 may be a region in which the thermoelectric semiconductor is disposed, and the terminal electrode part 400 may be a region in which the thermoelectric semiconductor is not disposed.

The terminal electrode part 400 may be disposed in an edge region of the second substrate 120. In detail, the terminal electrode part 400 may be disposed in a corner region of the second substrate 120.

Referring to FIGS. 3 to 6, the terminal electrode part 400 may extend in one direction from the second electrode part 220, and the terminal electrode part 400 may be disposed on the first surface 121 and the second surface 122 of the second substrate 120.

A hole may be formed in the second substrate 120. In detail, a connection hole CH may be formed in the second substrate 120. In detail, the connection hole CH may be formed on a region overlapping with a region in which the terminal electrode part 400 and the second electrode part 220 are in contact.

The terminal electrode part 400 may extend from the first surface 121 of the second substrate 120 to the second surface 122 through the connection hole CH. That is, the terminal electrode part 400 is disposed on the first surface 121 and the second surface 122 of the second substrate 120, and the terminal electrode part 400 disposed on the first surface 121 and the second surface 122 may be connected by the terminal electrode part 400 disposed in the connection hole CH.

In addition, a through hole H may be formed in the second substrate 120. In detail, the through hole H may be disposed between the terminal electrode part 400 and the second electrode part 220. In detail, the through hole H may be formed between the other second electrode part 220 other than the second electrode part 220 in contact with the terminal electrode part 400 and the terminal electrode part 400.

The through hole H may be formed to extend along side surfaces of the terminal electrode part 400 and the second electrode part 220 in contact with the terminal electrode part 400. The through hole H may be formed to extend from one side surface of the second substrate 120 toward the other side surface.

A width W of the through hole H may be different from a distance D between the terminal electrode part 400 and the second electrode part 220 closest to the terminal electrode part 400. In detail, the width W of the through hole H may be smaller than the distance D between the terminal electrode part 400 and the other second electrode part 220 other than the second electrode part 220 in contact with the terminal electrode part 400.

In detail, a ratio of the width W of the through hole H to the distance D between the terminal electrode part 400 and the second electrode part 220 closest to the terminal electrode part 400 may be 0.4:1 to 0.6:1. That is, a size of the width W of the through hole H may be about 40% to 60% with respect to a size of the distance D between the terminal electrode part 400 and the second electrode part 220 closest to the terminal electrode part 400.

When the width W of the through hole H is less than about 40% with respect to the size of the distance D between the terminal electrode part 400 and the second electrode part 220 closest to the terminal electrode part 400, cooling performance may be lowered due to heat transferred from a region in which the terminal electrode part 400 is disposed toward the second electrode part 220. In addition, when the width W of the through hole H exceeds about 60% with respect to the size of the distance D between the terminal electrode part 400 and the second electrode part 220 closest to the terminal electrode part 400, strength of the second substrate 120 may be lowered.

The through hole H may reduce the transfer of heat generated in the terminal electrode part 400 toward the second electrode part 220 adjacent to the terminal electrode part 400. That is, the heat generated in the terminal electrode part 400 in which the wiring electrode 500 is disposed may be moved toward the second electrode part 220. However, in the thermoelectric element according to the embodiment, an amount of heat moved toward the second electrode part 220 may be reduced by separating the terminal electrode part 400 and the second electrode part 220 by the through hole H.

Therefore, it is possible to reduce deterioration of cooling performance due to the heat in the second substrate acting as the cooling portion.

Meanwhile, referring to FIG. 6, a buffer member 700 may be disposed in the through hole H. For example, the buffer member 700 including a resin material or a polymer material may be disposed in the through hole H.

For example, the buffer member 700 may include a material having a low thermal conductivity. For example, the buffer member 700 may include a low thermal conductivity material such as polyimide, parylene, or the like.

The buffer member 700 may be disposed inside the through hole H. The buffer member 700 may be filled in the through hole H. The buffer member 700 may be disposed while filling an inside of the through hole H.

The buffer member 700 is disposed inside the through hole H to prevent the strength of the second substrate 120 in which the through hole H is formed from being lowered. In addition, the buffer member 700 may relieve a stress caused by contraction or expansion of the second substrate 120, which may occur in a region in which the temperature change of the substrate is largest by the terminal electrode part 400 in the second substrate 120, thereby improving overall reliability of the thermoelectric element.

Hereinafter, a thermoelectric element according to a second embodiment will be described with reference to FIGS. 7 to 10. In description of the thermoelectric element according to the second embodiment, description of the same or similar descriptions as those of the thermoelectric element according to the first embodiment described above will be omitted, and the same configurations are denoted by the same reference numerals.

Referring to FIGS. 7 to 10, a connection hole CH may not be formed in the thermoelectric element according to the second embodiment.

The second substrate 120 may include the first surface 121, the second surface 122, and the third surface 123.

The third surface 123 may be a surface connecting the first surface 121 and the second surface 122. The third surface 123 may be a side surface of the second substrate 120.

The terminal electrode part 400 may be formed to extend from the first surface 121 of the second substrate 120 to the third surface 123 and the second surface 122. That is, the terminal electrode part 400 may be formed to extend from the first surface 121 of the second substrate 120 to the second surface 122 through the third surface 123.

Accordingly, a process of forming a separate connection hole for connecting the terminal electrode part to the second substrate 120 may be omitted. Accordingly, it is possible to prevent the strength of the second substrate 120 from being lowered by the connection hole, thereby improving overall reliability of the thermoelectric element and improving process efficiency.

Hereinafter, the present invention will be described in more detail through thermoelectric elements according to Exemplary Embodiments and Comparative Examples. These embodiments are merely illustrative examples in order to describe the present invention in more detail. Therefore, the present invention is not limited to these embodiments.

Exemplary Embodiment 1

A second electrode part and a terminal electrode were disposed on a second substrate and a through hole was formed between the second electrode part and the terminal electrode to manufacture a thermoelectric element, and then a voltage was applied to the terminal electrode and a wiring electrode, and an amount of heat moved to the second electrode part was measured.

Exemplary Embodiment 2

A thermoelectric element was manufactured in the same manner as in Exemplary Embodiment 1, except that the through hole was filled with polyimide, and then an amount of heat moved to the second electrode part was measured after applying a voltage by connecting the terminal electrode and the wiring electrode.

Comparative Example 1

After a thermoelectric element was manufactured in the same manner as in Exemplary Embodiment 1 except that the through hole was not formed, a voltage was applied by connecting the terminal electrode and the wiring electrode, and then an amount of heat moved to the second electrode part was measured.

TABLE 1

|  | Exemplary Embodiment 1 | Exemplary Embodiment 2 | Comparative Example 1 |
| --- | --- | --- | --- |
| Heat transfer amount (mW) | 1.9 | 0.08 | 43 |

Referring to Table 1, it may be seen that heat transferred from the terminal electrode part to the second electrode part in case of the thermoelectric elements according to Exemplary Embodiments 1 and 2 is smaller than that of the thermoelectric element according to Comparative Example 1.

In detail, it may be seen that the heat transferred from the terminal electrode part to the second electrode part in case of the thermoelectric elements according to Exemplary Embodiments 1 and 2 is less than about 5% with respect to the thermoelectric element according to Comparative Example 1.

That is, in the thermoelectric element according to the embodiment, it may be seen that the heat moved from the terminal electrode part toward the second electrode part may be reduced by the through hole and a buffer member filled in the through hole.

Hereinafter, a thermoelectric element according to a third embodiment will be described with reference to FIGS. 11 and 12. In description of the thermoelectric element according to the third embodiment, description of the same or similar descriptions as those of the thermoelectric elements according to the first and second embodiments described above will be omitted, and the same configurations are denoted by the same reference numerals.

Figure 11:
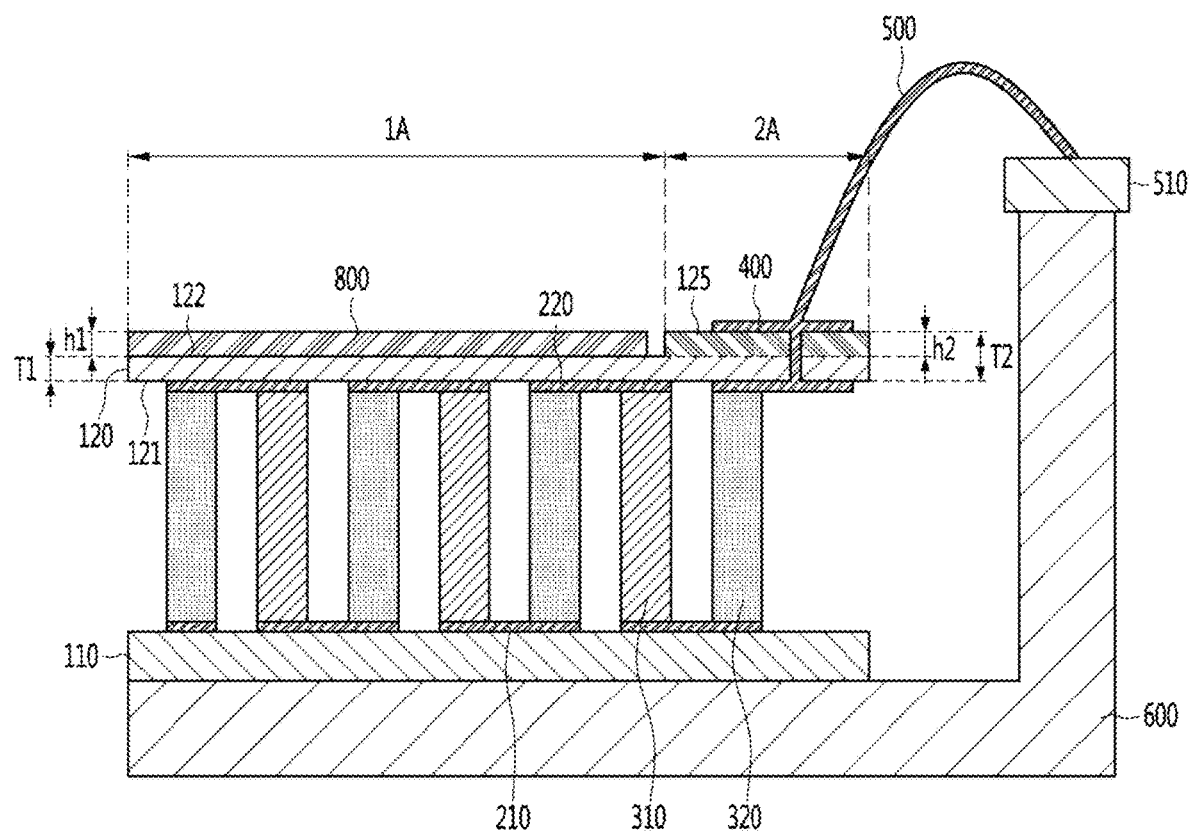
FIGS. 11 and 12 are partial cross-sectional views of a thermoelectric element according to a third embodiment.
Figure 12:
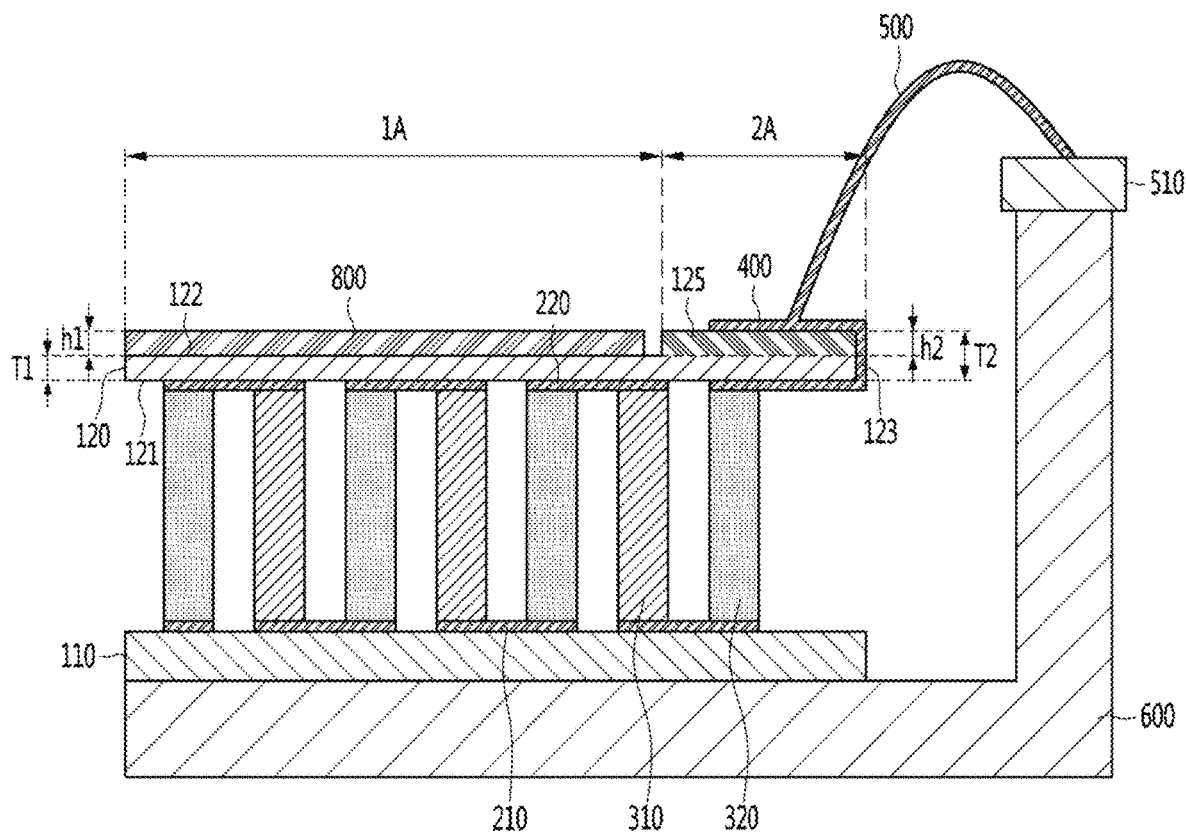

Referring to FIGS. 11 and 12, in the thermoelectric element according to the third embodiment, a thickness of a second substrate 120 may be different for each region.

In detail, the second substrate 120 may include a first region 1A and a second region 2A. The first region 1A may be a region in which the second electrode part 220 is disposed. In detail, the first region 1A may be defined as a region in which the second electrode part 220 on which the thermoelectric semiconductors 310 and 320 are disposed is disposed.

The second region 2A may be a region in which the terminal electrode part 400 is disposed. In detail, the second region 2A may be defined as a region in which the terminal electrode part 400 on which the thermoelectric semiconductors 310 and 320 are not disposed is disposed.

The first region 1A and the second region 2A may be disposed in contact with each other. The first region 1A and the second region 2A may include the same material. The first region 1A and the second region 2A may be integrally formed.

A thickness of the first region 1A and a thickness of the second region 2A may be different. In detail, the thickness of the first region 1A may be smaller than that of the second region 2A. That is, the thickness of the second region 2A may be larger than that of the first region 1A.

That is, the thickness of the second region 2A in which the terminal electrode part 400 is disposed may be thicker than that of the first region 1A in which the second electrode part 220 is disposed.

The second region 2A may include a stepped portion 125. The first region 1A and the second region 2A may have a step by the stepped portion 125. The thickness of the second region 2A may be larger than that of the first region 1A by the stepped portion 125.

A height h1 of the thermoelectric element chip 800 may be equal to or less than a height h2 of the stepped portion 125. That is, the height h1 of the thermoelectric element chip 800 may be equal to or smaller than the height h2 of the stepped portion 125. At this time, the height h1 of the thermoelectric element chip 800 may be defined as a distance from one surface of the thermoelectric element chip 800 facing the second substrate in the first region 1A to the other surface opposite to the one surface, and the height of the stepped portion 125 may be defined as a distance from one surface of the stepped portion 125 facing the second substrate in the second region 2A to the other surface opposite to the one surface.

Accordingly, the step between the thermoelectric element chip 800 and the stepped portion 125 may be reduced, and thus the thermoelectric element may be easily coupled with another module.

A thickness T2 of the second region 2A may be about 0.5 times to about 3 times larger than a thickness T1 of the first region 1A. In detail, the thickness T2 of the second region 2A may be about 1.5 times to about 3 times larger than the thickness T1 of the first region 1A.

When the thickness T2 of the second region 2A is less than about 0.5 times the thickness T1 of the first region 1A, it is not possible to effectively reduce vertical transfer of heat generated in the wiring electrode 500 and the terminal electrode part 400. In addition, when the thickness T2 of the second region 2A exceeds about three times the thickness T1 of the first region 1A, the process efficiency may be lowered.

The first region 1A and the second region 2A may have different thermal conductivities. In detail, the thermal conductivity of the second region 2A may be smaller than the thermal conductivity of the first region 1A.

In addition, the second region 2A may have anisotropic thermal conductivity. In addition, vertical thermal conductivity in the second region 2A may be about 30% or less. That is, the second region 2A may reduce the thermal conductivity in the vertical direction.

For example, the second region 2A may include a ceramic material. In detail, the second region 2A may include a boron nitride (BN) material. The ceramic material may be disposed throughout the second region 2A or may be disposed only at the stepped portion 125 of the second region 2A.

In the thermoelectric element according to the third embodiment, a thickness of a region in which the terminal electrode part is disposed may be larger than a thickness of a region in which the second electrode part is disposed. In addition, thermal conductivity of the region in which the terminal electrode part is disposed may be lower than thermal conductivity of the region in which the second electrode part is disposed. In addition, it is possible to reduce heat transferred in the vertical direction in the region in which the terminal electrode part is disposed.

Accordingly, when the terminal electrode part and the wiring electrode are bonded, mechanical impact due to a step with a frame may be mitigated by the stepped portion of the region in which the terminal electrode part is disposed, thereby improving reliability of the thermoelectric element.

In addition, an amount of heat when heat generated in the terminal electrode and the wiring electrode is moved in the direction of the second electrode part may be reduced by reducing the heat transfer in the vertical direction.

Hereinafter, the present invention will be described in more detail with reference to thermoelectric elements according to Exemplary Embodiments and Comparative Examples. These embodiments are merely illustrative examples in order to describe the present invention in more detail. Therefore, the present invention is not limited to these embodiments.

Exemplary Embodiment 3

After a stepped portion was formed on a second substrate and a second electrode part was disposed in a region in which the stepped portion was not disposed to manufacture a thermoelectric element, the terminal electrode and the wiring electrode were connected to apply a voltage, and then an amount of heat transferred to the second electrode part was measured.

Comparative Example 2

After a thermoelectric element was manufactured in the same manner as in Exemplary Embodiment 1, except that a stepped portion was not formed, the terminal electrode and the wiring electrode were connected to apply a voltage, and then an amount of heat transferred to the second electrode part was measured.

Table 2

|  | Exemplary Embodiment 3 | Comparative Example 2 |
| --- | --- | --- |
| Heat transfer amount (mW) | 0.5 | 17 |

Referring to Table 2, it may be seen that heat transferred from the terminal electrode part to the second electrode part in case of the thermoelectric element according to Exemplary Embodiments 3 is smaller than that of the thermoelectric element according to Comparative Example 2.

In detail, it may be seen that the heat transferred from the terminal electrode part to the second electrode part in case of the thermoelectric element according to Exemplary Embodiments 3 is less than about 3% with respect to the thermoelectric element according to Comparative Example 2.

That is, in the thermoelectric element according to the embodiment, it may be seen that the heat moved from the terminal electrode part toward the second electrode part may be reduced by the stepped portion.

Meanwhile, recently, there is a tendency to miniaturize the thermoelectric element, and when the thermoelectric element is disposed in a central region of a module such as a laser module for optical communication, or in case of a miniaturized thermoelectric element, it is difficult to connect the wiring electrode, that is, the terminal electrode and the electrode layer of the thermoelectric element. That is, since various components are mounted when wire bonding is performed to the terminal electrode, wire bonding is not easy.

Figure 13:
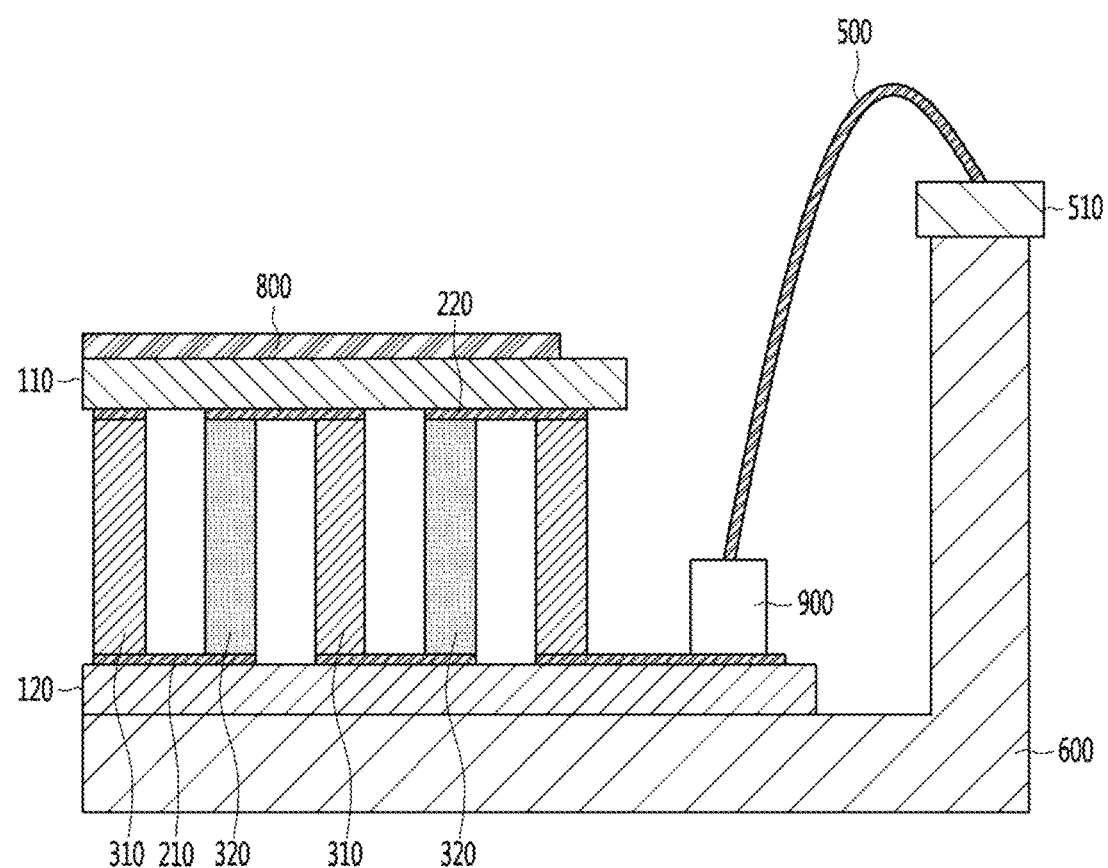
FIG. 13 is a partial cross-sectional view of a thermoelectric element in the related art.

To this end, in the related art, a post 900, that is, a metal column was disposed on a lower substrate as shown in FIG. 13, and an external power source and an electrode layer of a thermoelectric element was connected. However, an area of the lower substrate is larger than that of an upper substrate, and a thermoelectric semiconductor may not be disposed on the widened lower substrate, which is disadvantageous for miniaturization, and efficiency may be reduced compared to the area.

On the other hand, the thermoelectric element according to the embodiment may prevent a terminal wire bonding failure, and may realize a miniaturized thermoelectric element with improved efficiency.

That is, the thermoelectric element according to the embodiment may reduce the heat moving from the terminal electrode part toward the second electrode part.

In detail, the heat generated at the terminal electrode part in which the wiring electrode is disposed may be moved toward the second electrode part, but in the thermoelectric element according to the embodiment, the terminal electrode part and the second electrode part are separated by a through hole and a buffer member filled in the through hole, and thus an amount of heat transferred toward the second electrode part may be reduced.

Therefore, it is possible to reduce deterioration of cooling performance due to the heat in the second substrate acting as the cooling portion.

In addition, in the thermoelectric element according to the embodiment, a thickness of a region in which the terminal electrode part is disposed may be larger than a thickness of a region in which the second electrode part is disposed. In addition, thermal conductivity of the region in which the terminal electrode part is disposed may be lower than thermal conductivity of the region in which the second electrode part is disposed. In addition, it is possible to reduce heat transferred in the vertical direction in the region in which the terminal electrode part is disposed.

Accordingly, when the terminal electrode part and the wiring electrode are bonded, mechanical impact due to a step with a frame may be mitigated by the stepped portion of the region in which the terminal electrode part is disposed, thereby improving reliability of the thermoelectric element.

In addition, an amount of heat when heat generated in the terminal electrode and the wiring electrode is moved in the direction of the second electrode part may be reduced by reducing the heat transfer in the vertical direction.

Accordingly, since the thermoelectric element according to the embodiment achieves miniaturization, and wire bonding is performed on the upper substrate instead of the lower substrate, additional thermoelectric semiconductors may be disposed in the bonding region, thereby improving thermoelectric efficiency. In addition, the thermoelectric element according to the embodiment may reduce bonding failures by reducing the step of wire bonding, thereby having improved reliability.

Meanwhile, thermoelectric legs of the thermoelectric elements according to the above-described embodiments may have a stack type structure. For example, a P-type thermoelectric leg or a N-type thermoelectric leg may be formed by stacking a plurality of structures coated with a semiconductor material on a sheet-shaped base material and cutting the same. Accordingly, it is possible to prevent loss of the material and improve an electric conduction characteristic.

Figure 14:
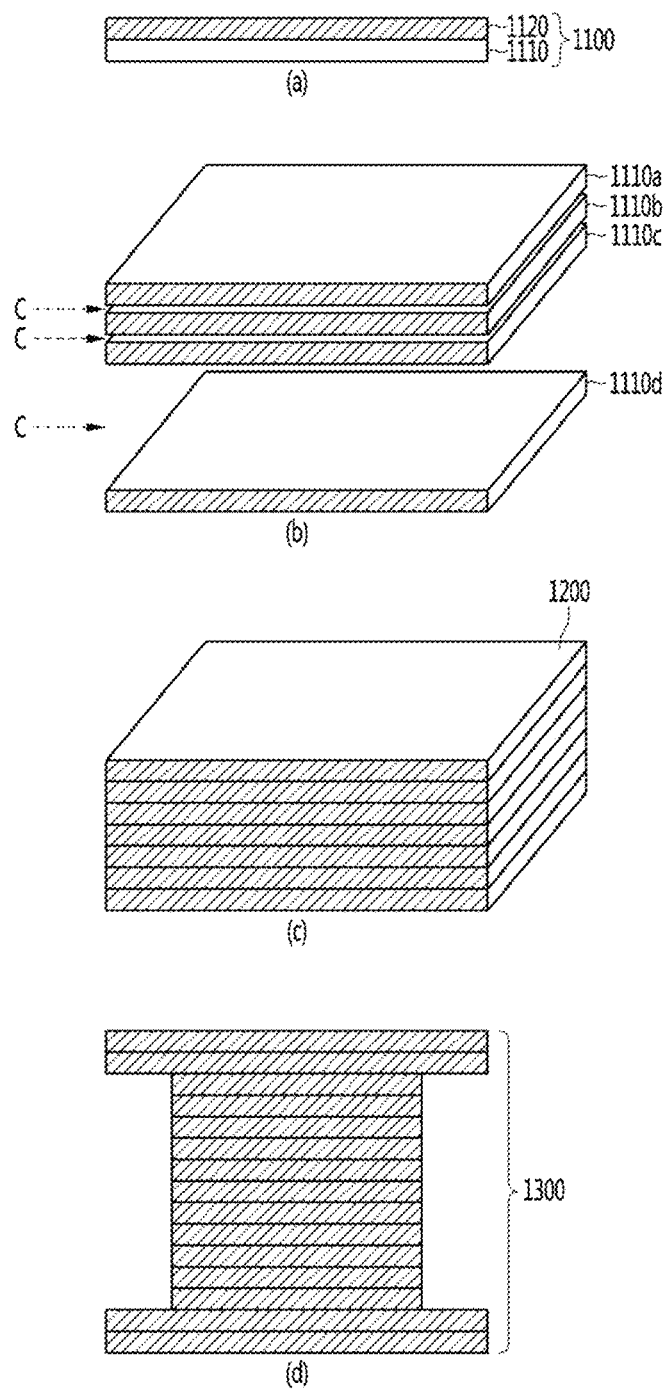

FIG. 14 shows a method of manufacturing a thermoelectric leg of a stack type structure.

Referring to FIG. 14, a material including a semiconductor material is produced in a form of paste, and then applied on a base material 1110 such as a sheet or a film to form a semiconductor layer 1120. Accordingly, one unit member 1100 may be formed.

A plurality of unit members 1100a, 1100b, and 1100c are stacked to form a stacked structure 1200, and a unit thermoelectric leg 1300 may be obtained by cutting the same.

As described above, the unit thermoelectric leg 1300 may be formed by a structure in which the unit member 1100 in which the semiconductor layer 1120 is formed on the base material 1110 is stacked in plural.

Here, a process of applying paste on the base material 1110 may be performed in various ways. For example, it may be performed by a tape casting method. The tape casting method is a method in which a powder of a fine semiconductor material is mixed with at least one selected from among an aqueous or non-aqueous solvent, a binder, a plasticizer, a dispersant, a defoamer, and a surfactant to manufacture in a shape of a slurry, and then the slurry is molded on a moving blade or moving base material. At this time, the base material 1110 may be a film, a sheet, or the like having a thickness of 10 to 100 μm, and as the semiconductor material to be applied to the base material 1110, the P-type thermoelectric material or the N-type thermoelectric material for manufacturing the above-described bulk-type element may be applied as it is.

A process of aligning and stacking the unit member 1100 in a plurality of layers may be performed by a method of pressing at a temperature of 50° C. to 250° C., and a number of the unit members 1100 to be stacked may be, for example, 2 to 50. Thereafter, it may be cut into a desired shape and size, and a sintering process may be added.

The unit thermoelectric leg 1300 manufactured in this manner may ensure uniformity in thickness, shape, and size, and may be advantageous in thinning and may reduce loss of materials.

The unit thermoelectric leg 1300 may have a cylindrical columnar shape, a polygonal columnar shape, an elliptical columnar shape, or the like, and may be cut into a shape as illustrated in FIG. 14D.

Meanwhile, a conductive layer may be further formed on one surface of the unit member 1100 in order to manufacture the thermoelectric leg of the stack type structure.

FIG. 15 illustrates a conductive layer formed between unit members in the stacked structure of FIG. 14.

Referring to FIG. 15, a conductive layer C may be formed on an opposite side of a base material 1110 on which a semiconductor layer 1120 is formed, and may be patterned such that a part of a surface of the base material 1110 is exposed.

FIG. 15 shows various modified examples of the conductive layer C according to an embodiment of the present invention. The conductive layer C may be variously modified to a mesh type structure including closed-type opening patterns c1 and c2 as shown in FIGS. 15A and 15B, a line-type structure including open-type opening patterns c3 and c4 as shown in FIGS. 15C and 15D, or the like.

The conductive layer C may increase adhesion between unit members in a unit thermoelectric leg formed of the stack type structure of the unit members, lower thermal conductivity between the unit members, and improve electrical conductivity. The conductive layer C may be a metal material, for example, Cu, Ag, Ni or the like.

Meanwhile, the unit thermoelectric leg 1300 may be cut in the same direction as shown in FIG. 16. According to such a structure, the heat conduction efficiency in the vertical direction may be lowered and simultaneously, the electric conduction characteristic may be improved, thereby improving the cooling efficiency.

Meanwhile, the thermoelectric leg according to the above-described embodiments may be manufactured according to a zone melting method or a powder sintering method. According to the zone melting method, after an ingot is manufactured by using a thermoelectric material, heat is slowly applied to the ingot to refine particles so as to be rearranged in a single direction, and the thermoelectric leg is obtained by a method of slow cooling. According to the powder sintering method, an ingot is manufactured by using a thermoelectric material, and then the ingot is pulverized and sieved to obtain thermoelectric leg powder, and the thermoelectric leg is obtained through a process of sintering the same.

Figure 17:
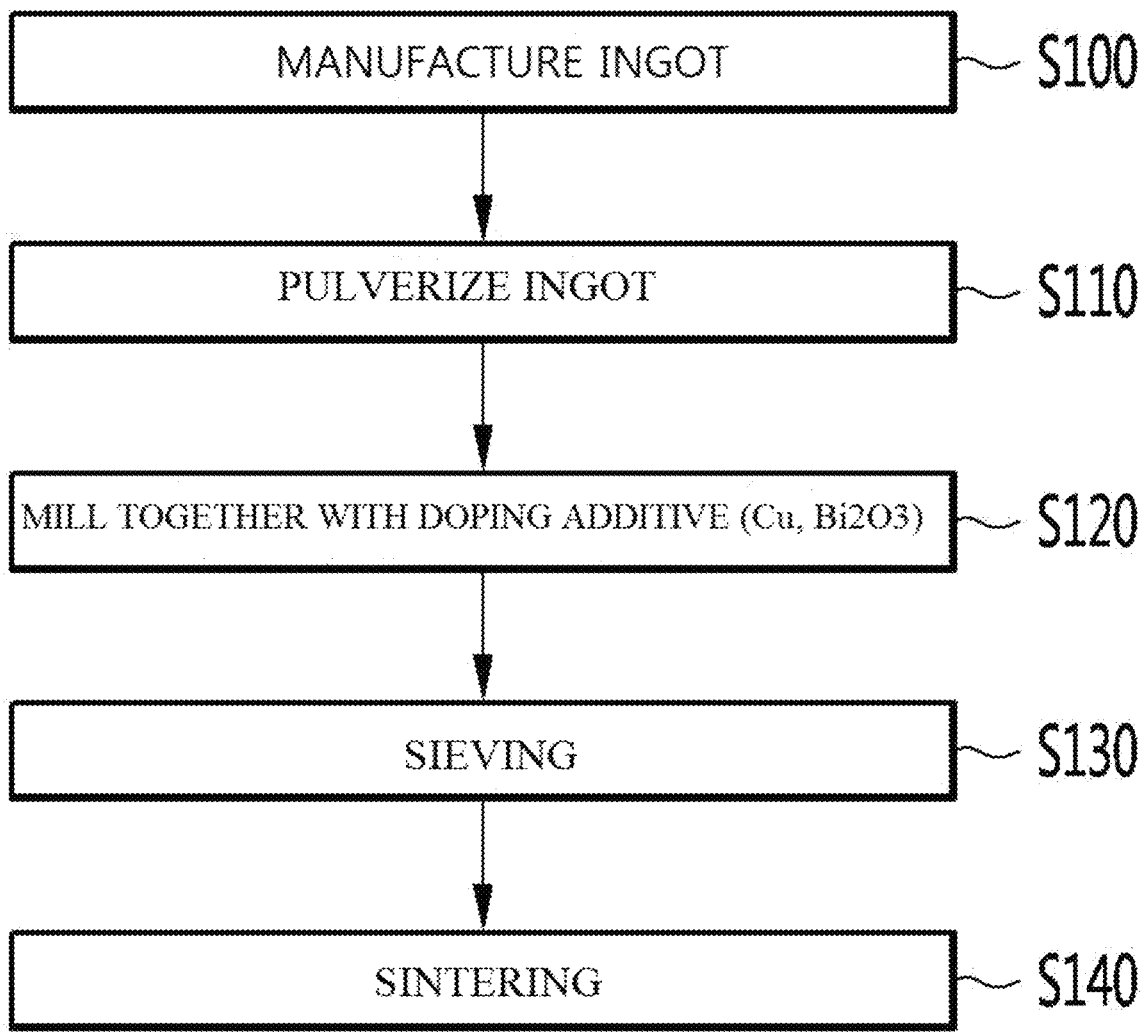
FIG. 17 is a view showing a process flow chart for manufacturing a sintered body for a thermoelectric leg according to an embodiment.

FIG. 17 is a flowchart showing a method of manufacturing a sintered body for a thermoelectric leg according to one embodiment of the present invention.

Referring to FIG. 17, a thermoelectric material is thermally treated to manufacture an ingot (S100). The thermoelectric material may include Bi, Te and Se. For example, the thermoelectric material may include Bi2Te3-ySey (0.1<y<0.4). Meanwhile, steam pressure of Bi is 10 Pa at 768° C., steam pressure of Te is 104 Pa at 769° C., and steam pressure of Se is 105 Pa at 685° C. Therefore, vapor pressure of Te and Se is high at a general melting temperature (600 to 800° C.), and thus volatility is high. Therefore, at the time of manufacturing the thermoelectric leg, it may be weighed in consideration of volatilization of at least one of Te and Se. That is, at least one of Te and Se may be further included in 1 to 10 parts by weight. For example, when manufacturing an N-type leg, 1 to 10 parts by weight of Te and Se may be further included with respect to 100 parts by weight of Bi2Te3-ySey (0.1<y<0.4).

Next, the ingot is pulverized (S110). At this time, the ingot may be pulverized according to a melt spinning technique. Accordingly, a thermoelectric material of a plate-like flake may be obtained.

Next, the thermoelectric material of a plate-like flake is milled together with a doping additive (S120). To this end, for example, a super mixer, a ball mill, an attrition mill, a 3-roll mill, or the like may be used. Here, the doping additive may contain Cu and Bi2O3. In this case, a thermoelectric material containing Bi, Te and Se may be milled after being added at a composition ratio of 99.4 to 99.98 wt %, 0.01 to 0.1 wt % of Cu, and 0.01 to 0.5 wt % of Bi2O3. Preferably, the thermoelectric material containing Bi, Te and Se may be milled after being added at a composition ratio of 99.48 to 99.98 wt %, 0.01 to 0.07 wt % of Cu, and 0.01 to 0.45 wt % of Bi2O3. And more preferably, the thermoelectric material containing Bi, Te and Se may be milled after being added at a composition ratio of 99.67 to 99.98 wt %, 0.01 to 0.03 wt % of Cu, and 0.01 to 0.30 wt % of Bi2O3.

Next, thermoelectric leg powder is obtained through sieving (S130). However, the sieving process is added as needed, and is not an essential process in the embodiment of the present invention. At this time, the thermoelectric leg powder may have, for example, a particle size of micro units.

Next, the thermoelectric leg powder is sintered (S140). The thermosetting leg may be manufactured by cutting the sintered body obtained through the sintering process. For example, sintering may be performed for about 1 minute to about 30 minutes under conditions of about 400° C. to about 550° C. and about 35 MPa to about 60 MPa by using a spark plasma sintering (SPS) machine, or may be performed for about 1 minute to about 60 minutes under conditions of about 400° C. to about 550° C. and about 180 MPa to about 250 MPa by using a hot-press machine.

At this time, the thermoelectric leg powder may be sintered together with an amorphous ribbon. When the thermoelectric leg powder is sintered together with the amorphous ribbon, electrical conductivity is increased, so that high thermoelectric performance may be obtained. At this time, the amorphous ribbon may be an Fe-based amorphous ribbon.

As an example, the amorphous ribbon may be sintered after the thermoelectric legs are disposed on a surface for bonding to an upper electrode and a surface for bonding to a lower electrode. Accordingly, the electric conductivity may be increased in a direction of the upper electrode or the lower electrode. To this end, a lower amorphous ribbon, the thermoelectric leg powder, and an upper amorphous ribbon may be sequentially disposed in a mold and then sintered. At this time, a surface treatment layer may be formed on the lower amorphous ribbon and the upper amorphous ribbon, respectively. The surface treatment layer is a thin film formed by a plating method, a sputtering method, a vapor deposition method, etc., and it is possible to use nickel or the like which hardly changes its performance even when it reacts with the powder of the thermoelectric leg which is a semiconductor material.

As another example, the amorphous ribbon may be disposed on a side surface of the thermoelectric leg and then sintered. Accordingly, the electric conductivity may be increased along the side surface of the thermoelectric leg. To this end, after the amorphous ribbon is disposed so as to surround a wall surface of the mold, the thermoelectric leg powder may be filled and sintered.

A thermoelectric element according to embodiments of the present invention may be applied to a power generation device, a cooling device, a heating device, and the like. In detail, the thermoelectric element may be mainly applied to an optical communication module, a sensor, a medical instrument, a measuring instrument, an aerospace industry, a refrigerator, a chiller, a car ventilation sheet, a cup holder, a washing machine, a dryer, a wine cellar, a water purifier, a power supply for sensors, a thermopile, and the like.

Here, an example in which a thermoelectric element according to an embodiment of the present invention is applied to a medical instrument, is a polymerase chain reaction (PCR) device. The PCR device is an equipment for amplifying DNA to determine the base sequence of DNA, and is a device that requires precise temperature control and thermal cycling. To this end, a thermoelectric element based on the Peltier effect may be applied.

Another example in which a thermoelectric element according to an embodiment of the present invention is applied to a medical instrument, is a photodetector. Here, the photodetector includes an infrared/ultraviolet detector, a charge coupled device (CCD) sensor, an X-ray detector, and a thermoelectric thermal reference source (TTRS). A thermoelectric element based on the Peltier effect may be applied for cooling the photodetector. And thus, it is possible to prevent a wavelength change, an output decrease, and a resolution decrease due to a temperature rise inside the photodetector.

Still another example in which a thermoelectric element according to an embodiment of the present invention is applied to a medical instrument, includes a field of immunoassay, a field of in vitro diagnostics, general temperature control and cooling systems, physical therapy, a liquid chiller system, and a field of blood/plasma temperature control, etc. And thus, it is possible to control a temperature precisely.

Still another example in which a thermoelectric element according to an embodiment of the present invention is applied to a medical instrument, is an artificial heart. And thus, it is possible to supply power to the artificial heart.

An example in which a thermoelectric element according to an embodiment of the present invention is applied to an aerospace industry, includes a star tracking system, a thermal imaging camera, an infrared/ultraviolet detector, a CCD sensor, a hubble space telescope, TTRS, and the like. And thus, it is possible to maintain a temperature of an image sensor.

Another example in which a thermoelectric element according to an embodiment of the present invention is applied to the aerospace industry, includes a cooling device, a heater, a power generation device, and the like.

In addition, a thermoelectric element according to an embodiment of the present invention may be applied to other industries for power generation, cooling, and heating.

Hereinbefore, embodiments have been described with reference to preferred embodiments of the present invention. However, it will be understood by those skilled in the art that various changes and modifications may be made therein without departing from the spirit and scope of the present invention defined in the following claims.

The invention claimed is:

1. A thermoelectric element comprising:
a first substrate;
a first electrode part disposed on the first substrate;
a semiconductor structure disposed on the first electrode part;
a second electrode part disposed on the semiconductor structure; and
a second substrate disposed on the second electrode part,
wherein the second substrate includes a first surface and a second surface opposite to the first surface,
the second electrode part is disposed on the first surface,
a terminal electrode part formed by extending at least one of the second electrode parts is disposed on the second surface, and
the second substrate includes a through hole formed between the terminal electrode part and the second electrode part,
the through hole is formed to extend from one side surface of the second substrate toward the other side surface,
wherein the second substrate further includes a via electrode for forming the terminal electrode part,
wherein the via electrode overlaps the first substrate, and does not overlap the semiconductor structure,
wherein a ratio of a width of the through hole to a distance between the terminal electrode part and the second electrode part closest to the terminal electrode part is 0.4:1 to 0.6:1.

2. A thermoelectric element comprising:
a first substrate;
a first electrode disposed on the first substrate;
a single semiconductor structure disposed on the first electrode;
a second electrode disposed on the single semiconductor structure, wherein an entirety of the single semiconductor structure is a single leg disposed between the first electrode and the second electrode;
a second substrate disposed on the second electrode; and
a terminal electrode disposed on the second substrate,
wherein the second substrate includes a first surface facing the second electrode, a second surface opposite to the first surface, a via electrode passing through the first surface and the second surface, and a through hole passing through the first surface and the second surface,
wherein the terminal electrode electrically contacts the second electrode through the via electrode,
wherein the second substrate includes a first region in which the terminal electrode and the via electrode are disposed, and a second region except for the first region,
wherein an area of the second region is greater than an area of the first region,
wherein the via electrode overlaps the first substrate, and does not overlap the single semiconductor structure in a thickness direction of the second substrate,
wherein a virtual plane of the via electrode is aligned with the via electrode in the thickness direction,
wherein the virtual plane of the via electrode and the single semiconductor structure are spaced apart from each other in a longitudinal direction of the second substrate, and the longitudinal direction is perpendicular to the thickness direction,
wherein a distance, in the longitudinal direction, between the virtual plane of the via electrode and the single semiconductor structure is greater than a width of the via electrode in the longitudinal direction,
wherein the distance, in the longitudinal direction, between the virtual plane of the via electrode and the single semiconductor structure is smaller than a width of the single semiconductor structure in the longitudinal direction, and
wherein the width of the via electrode in the longitudinal direction is less than the width of the single semiconductor structure in the longitudinal direction,
wherein the through hole extends in a first direction along the second surface of the second substrate and adjacent to a side surface of the terminal electrode on the second surface of the second substrate, and the through hole extends in the first direction along the first surface of the second substrate and adjacent to a side surface of the second electrode on the first surface of the second substrate,
wherein a ratio of a width of the through hole to a distance between the terminal electrode and the second electrode closest to the terminal electrode is 0.4:1 to 0.6:1.

3. The thermoelectric element of claim 2, wherein a width of the terminal electrode is greater than the width of the via electrode.

4. The thermoelectric element of claim 3, comprising a thermoelectric element chip disposed on the second surface of the second region of the second substrate,
wherein the thermoelectric element chip does not contact with the terminal electrode.

5. The thermoelectric element of claim 2, wherein a width of the terminal electrode is smaller than a width of the first region of the second substrate.

6. The thermoelectric element of claim 2, wherein an area of a top surface of the terminal electrode is greater than an area of a top surface of the via electrode.

7. The thermoelectric element of claim 2, wherein the terminal electrode overlaps the single semiconductor structure vertically.

8. The thermoelectric element of claim 7, wherein the terminal electrode overlaps at least one of the first electrode and the second electrode vertically.

9. The thermoelectric element of claim 7, wherein an area of the first substrate is different than an area of the second substrate.

10. The thermoelectric element of claim 2, wherein the terminal electrode electrically contacts an outer frame.

11. The thermoelectric element of claim 2, wherein the second substrate comprises a ceramic material.

12. The thermoelectric element of claim 2, wherein the first region is disposed closer to an end of the second substrate than the second region.

13. The thermoelectric element of claim 2, wherein an area of the terminal electrode is greater than an area of the via electrode.

14. The thermoelectric element of claim 9,
wherein the area of the second substrate is smaller than the area of the first substrate.

\* \* \* \* \*